(12) United States Patent
Yoshikawa

(10) Patent No.: US 11,792,925 B2
(45) Date of Patent: *Oct. 17, 2023

(54) PRINTED WIRING BOARD

(71) Applicant: IBIDEN CO., LTD., Gifu (JP)

(72) Inventor: Kyohei Yoshikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/555,575

(22) Filed: Dec. 20, 2021

(65) Prior Publication Data

US 2022/0201855 A1 Jun. 23, 2022

(30) Foreign Application Priority Data

Dec. 21, 2020 (JP) .................. 2020-211063

(51) Int. Cl.
*H05K 1/11* (2006.01)
*H05K 1/02* (2006.01)
*H05K 1/03* (2006.01)

(52) U.S. Cl.
CPC ......... *H05K 1/0313* (2013.01); *H05K 1/0298* (2013.01); *H05K 1/11* (2013.01); *H05K 1/0242* (2013.01); *H05K 1/0296* (2013.01)

(58) Field of Classification Search
CPC ...... H05K 1/0313; H05K 1/0298; H05K 1/11; H05K 3/28; H05K 2201/09727; H05K 2203/0307; H05K 3/383; H05K 1/0242
See application file for complete search history.

(56) References Cited

U.S. PATENT DOCUMENTS

| 7,935,893 | B2* | 5/2011 | Tanaka | H05K 1/185 438/424 |
| 8,164,920 | B2* | 4/2012 | Kariya | H05K 1/162 361/764 |
| 8,533,943 | B2* | 9/2013 | En | H05K 3/067 29/829 |
| 2016/0066423 | A1* | 3/2016 | Sakamoto | H01L 23/49822 29/846 |
| 2020/0315011 | A1* | 10/2020 | Nakamura | H05K 3/4644 |

FOREIGN PATENT DOCUMENTS

JP 2000-022334 A 1/2000

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a first resin insulating layer, a second resin insulating layer formed on a surface of the first layer, and a conductor layer formed on the surface of the first layer such that the second layer is covering the conductor layer and that the conductor layer includes first, second, third, fourth, fifth, and sixth circuits such that the third and fourth circuits are sandwiching the first circuit and that the fifth and sixth circuits are sandwiching the second circuit. Widths between the first and third circuits and between the first and fourth circuits are 5 μm to 14 μm, and when a width between the second and fifth circuits and a width between the second and sixth circuits is 20 μm or more, the upper surface of the first circuit, and the upper surface and side walls of the second circuit are formed to have unevenness.

20 Claims, 3 Drawing Sheets

PRINTED WIRING BOARD

CROSS-REFERENCE TO RELATED APPLICATIONS

The present application is based upon and claims the benefit of priority to Japanese Patent Application No. 2020-211063, filed Dec. 21, 2020, the entire contents of which are incorporated herein by reference.

BACKGROUND OF THE INVENTION

Field of the Invention

The present invention relates to a printed wiring board having a resin insulating layer and a conductor layer.

Description of Background Art

Japanese Patent Application Laid-Open Publication No. 2000-22334 describes a printed wiring board having conductor circuits and a resin insulating layer. As illustrated in FIG. 6 of Japanese Patent Application Laid-Open Publication No. 2000-22334, a roughened layer is formed on entire surfaces of the conductor circuits in Japanese Patent Application Laid-Open Publication No. 2000-22334. The entire contents of this publication are incorporated herein by reference.

SUMMARY OF THE INVENTION

According to one aspect of the present invention, a printed wiring board includes a first resin insulating layer, a second resin insulating layer formed on a surface of the first resin insulating layer, and a conductor layer formed on the surface of the first resin insulating layer such that the second resin insulating layer is covering the conductor layer and that the conductor layer includes a first conductor circuit, a second conductor circuit, a third conductor circuit positioned to a first side of the first conductor circuit, a fourth conductor circuit positioned to a second side of the first conductor circuit on the opposite side with respect to the first side of the first conductor circuit, a fifth conductor circuit positioned to a first side of the second conductor circuit, and a sixth conductor circuit positioned to a second side of the second conductor circuit on the opposite side with respect to the first side of the second conductor circuit such that the third and fourth conductor circuits are sandwiching the first conductor circuit and that the fifth and sixth conductor circuits are sandwiching the second conductor circuit. The first conductor circuit has a first width, the second conductor circuit has a second width, the first and third conductor circuits are positioned to form a third space having a third width between the first and third conductor circuits such that the third width is in a range of 5 μm to 14 μm, the first and fourth conductor circuits are positioned to form a fourth space having a fourth width between the first and fourth conductor circuits such that the fourth width is in a range of 5 μm to 14 μm, the second and fifth conductor circuits are positioned to form a fifth space having a fifth width between the second and fifth conductor circuits, the second and sixth conductor circuits are positioned to form a sixth space having a sixth width between the second and sixth conductor circuits, the first conductor circuit has a first lower surface in contact with the surface of the first resin insulating layer, a first upper surface on the opposite side with respect to the first lower surface, a third side wall facing the third conductor circuit, and a fourth side wall facing the fourth conductor circuit, the second conductor circuit has a second lower surface in contact with the surface of the first resin insulating layer, a second upper surface on the opposite side with respect to the second lower surface, a fifth side wall facing the fifth conductor circuit, and a sixth side wall facing the sixth conductor circuit, and when each of the fifth and sixth widths is 20 μm or more, the first upper surface of the first conductor circuit, and the second upper surface, fifth side wall and sixth side wall of the second conductor circuit are formed to have unevenness.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
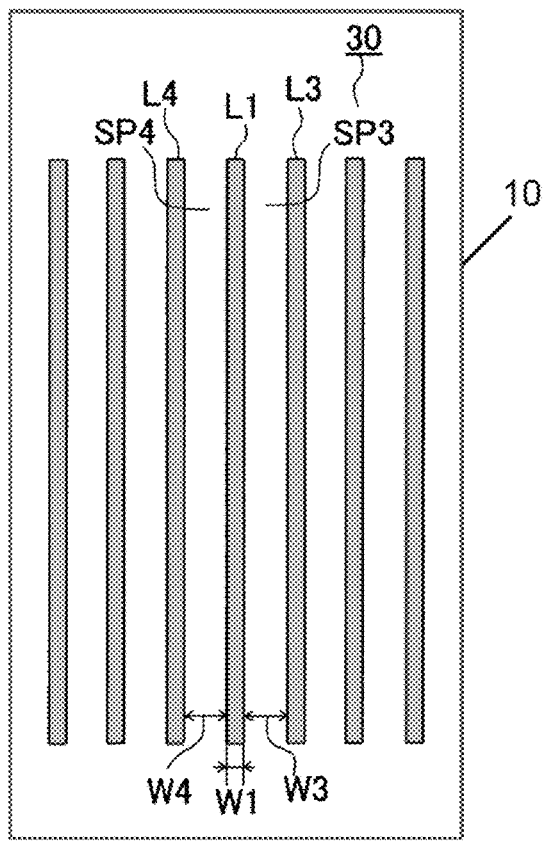
FIGS. 1A and 1B are plan views of a conductor layer.

Embodiments will now be described with reference to the accompanying drawings, wherein like reference numerals designate corresponding or identical elements throughout the various drawings.

Figure 3A:
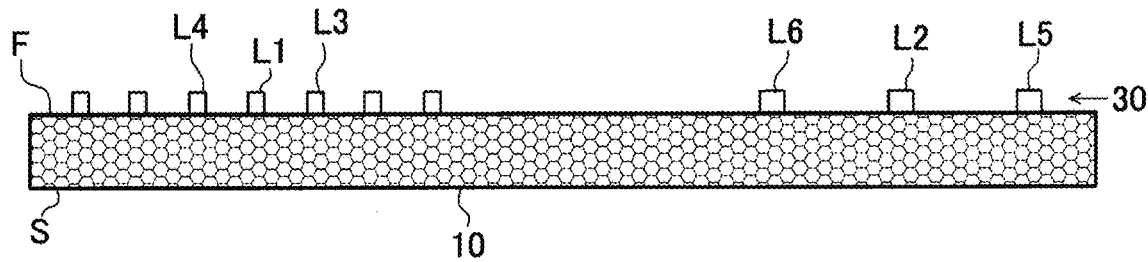
FIGS. 3A-3D are manufacturing process diagrams of the printed wiring board of the embodiment.
Figure 3B:
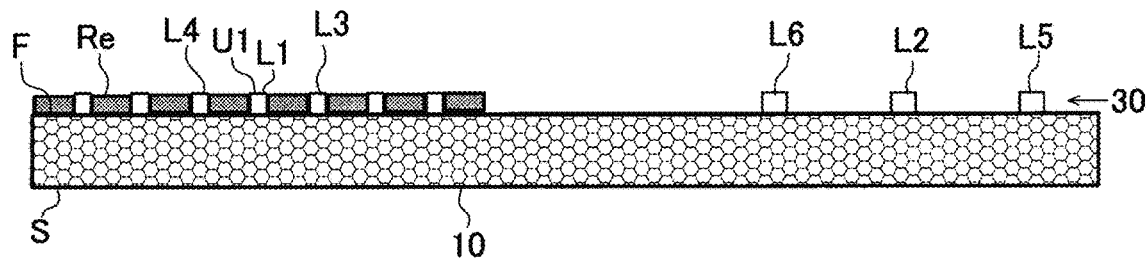
Figure 3C:
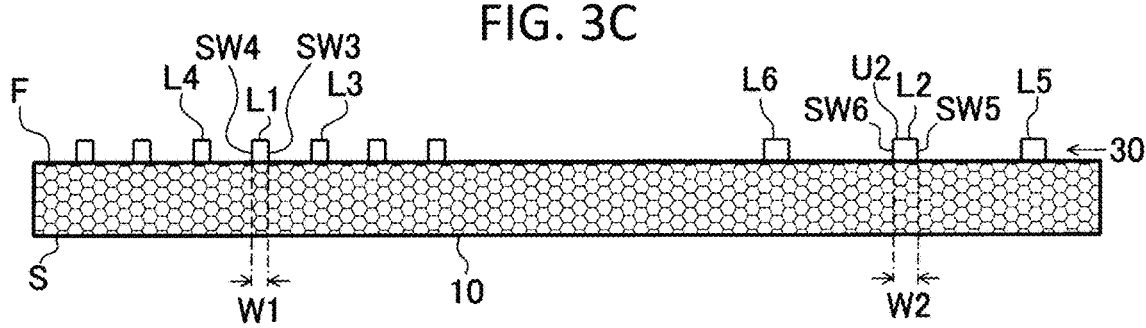
Figure 3D:
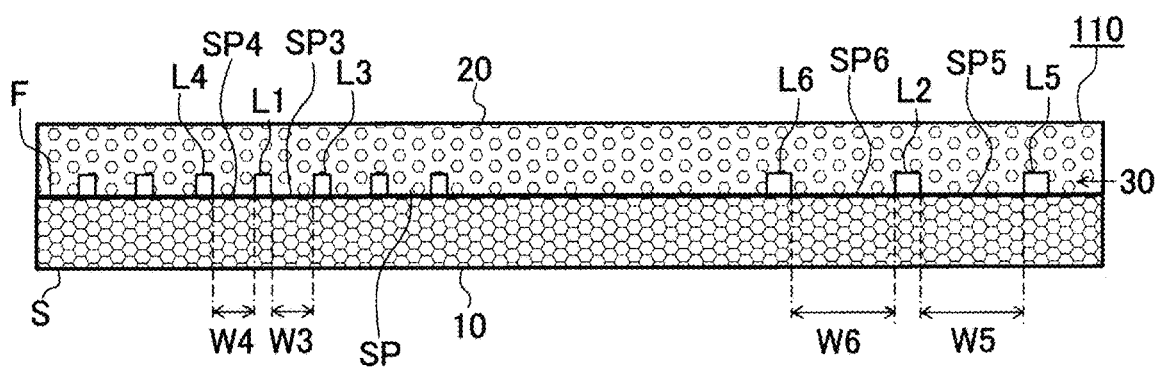

FIG. 3D illustrates a cross section of a printed wiring board 110 of an embodiment.

Figure 1B:
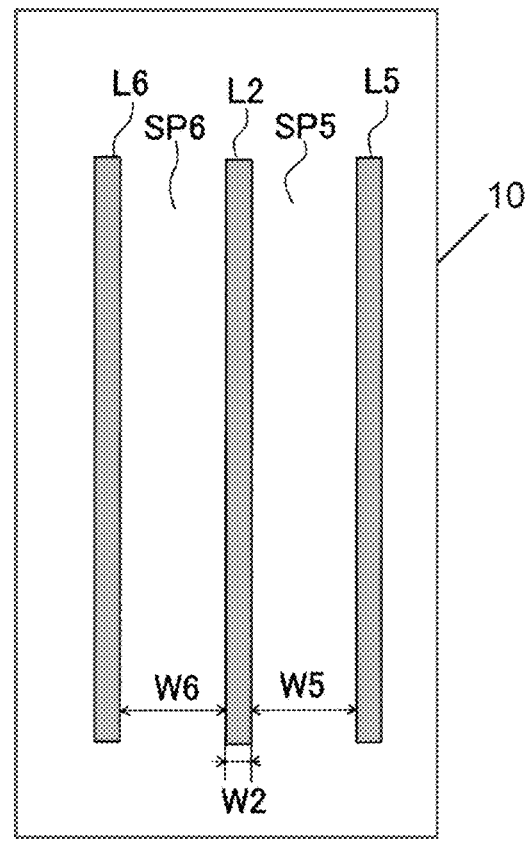

The printed wiring board 110 includes a first resin insulating layer 10 having a first surface (F) and a second surface (S) on the opposite side with respect to the first surface (F), a conductor layer 30 formed on the first surface (F) of the first resin insulating layer 10, and a second resin insulating layer 20 formed on the first surface (F) of the first resin insulating layer 10 and on the conductor layer 30. The second resin insulating layer 20 fills spaces (SP) between conductor circuits forming the conductor layer 30. FIGS. 1A and 1B are plan views illustrating an upper surface of the conductor layer 30.

As illustrated in FIG. 1A, the conductor layer 30 includes a first conductor circuit (L1) and conductor circuits (a third conductor circuit (L3) and a fourth conductor circuit (L4)) sandwiching the first conductor circuit (L1). The third conductor circuit (L3) is positioned to the right of the first conductor circuit (L1), and the fourth conductor circuit (L4) is positioned to the left of the first conductor circuit (L1). As illustrated in FIG. 1B, the conductor layer 30 includes a second conductor circuit (L2) and conductor circuits (a fifth conductor circuit (L5) and a sixth conductor circuit (L6)) sandwiching the second conductor circuit (L2). The fifth conductor circuit (L5) is positioned to the right of the second conductor circuit (L2), and the sixth conductor circuit (L6) is positioned to the left of the second conductor circuit (L2).

Figure 1C:
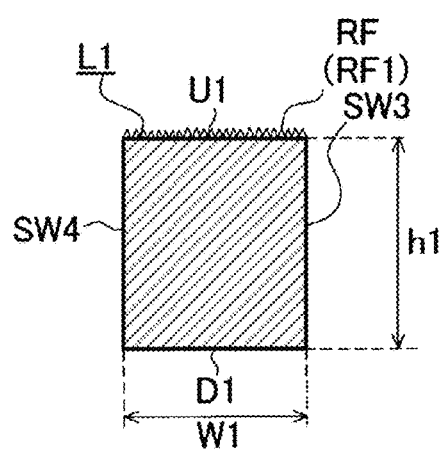
FIG. 1C is a cross-sectional view of a first conductor circuit.
Figure 2A:
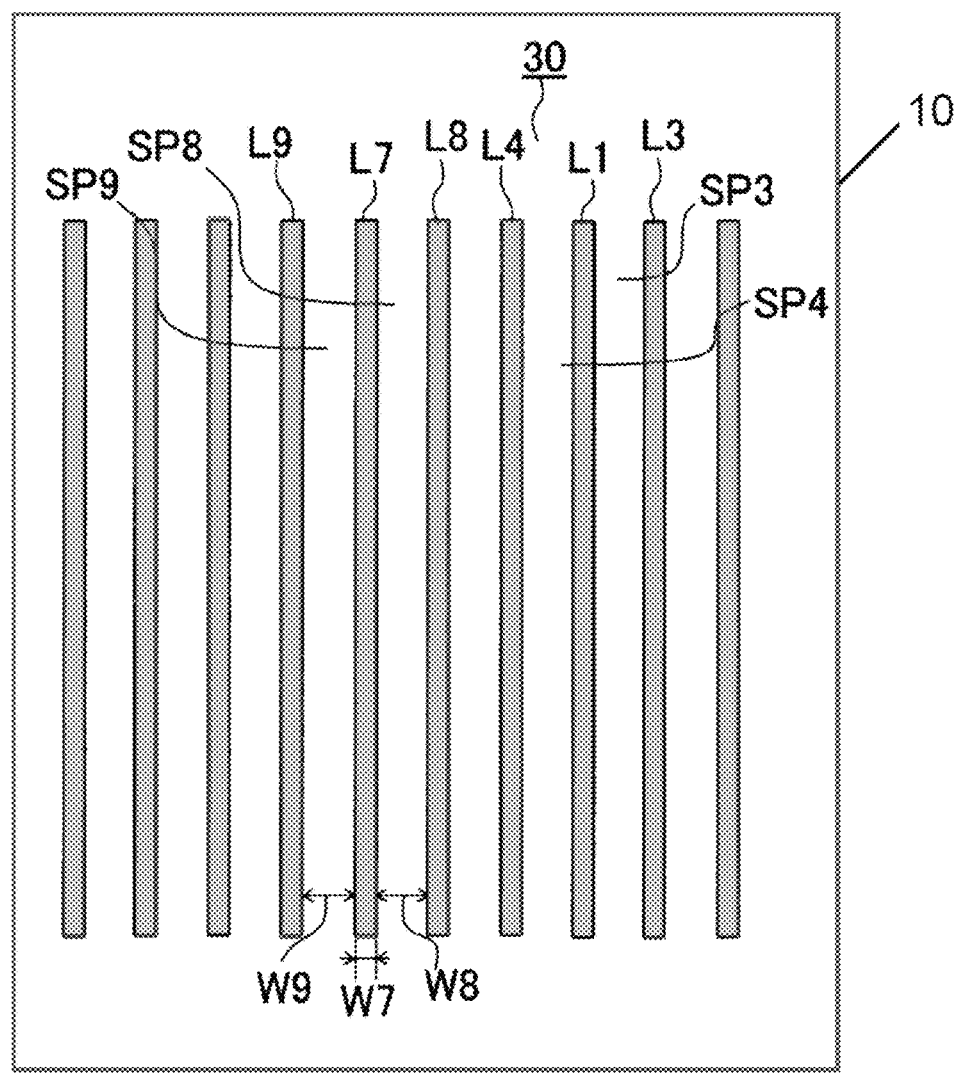
FIG. 2A is a plan view of the conductor layer of the embodiment.
Figure 2B:
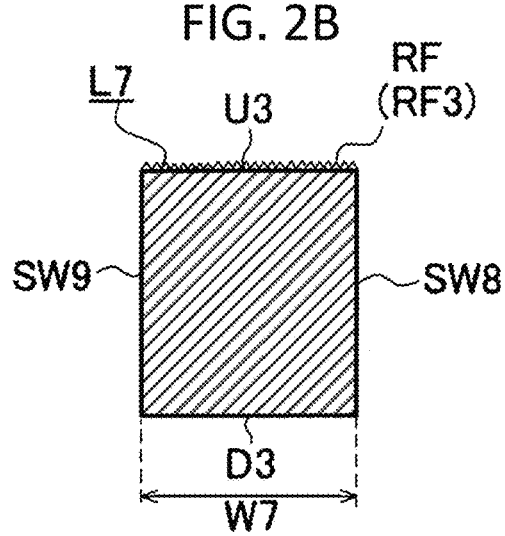
FIG. 2B is a cross-sectional view of a seventh conductor circuit.
Figure 2C:
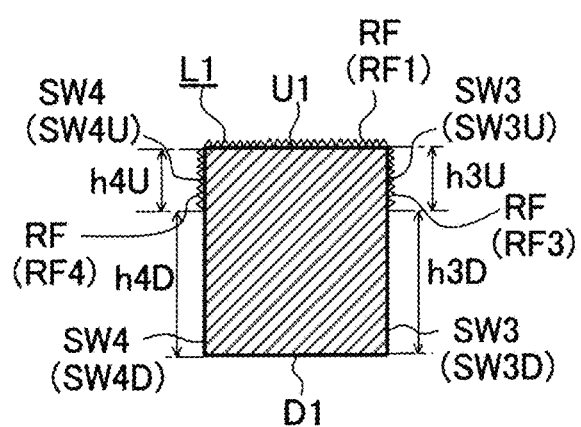
FIG. 2C is a cross-sectional view of the first conductor circuit.

FIGS. 1C and 2C each illustrate a cross section of the first conductor circuit (L1). The first conductor circuit (L1) illustrated in FIG. 1C is a first example. The first conductor circuit (L1) illustrated in FIG. 2C is a second example.

The first conductor circuit (L1) has a first lower surface (D1) in contact with the first surface (F) of the first resin insulating layer 10, a first upper surface (U1) on the opposite side with respect to the first lower surface (D1), a third side wall (SW3) facing the third conductor circuit (L3), and a fourth side wall (SW4) facing the fourth conductor circuit (L4). The first conductor circuit (L1) has a first width (W1).

Figure 1D:
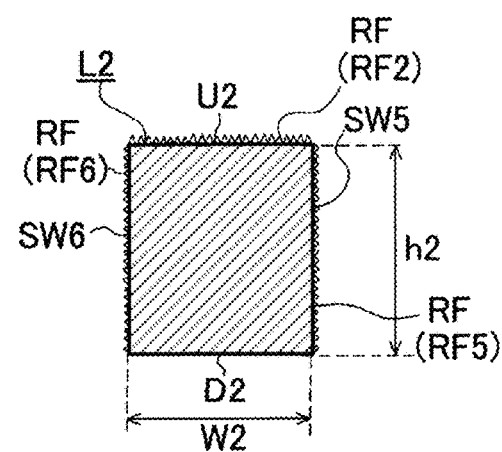
FIG. 1D is a cross-sectional view of a second conductor circuit.

FIG. 1D illustrates an example of a cross section of the second conductor circuit (L2).

The second conductor circuit (L2) has a second lower surface (D2) in contact with the first surface (F) of the first resin insulating layer 10, a second upper surface (U2) on the opposite side with respect to the second lower surface (D2), a fifth side wall (SW5) facing the fifth conductor circuit (L5), and a sixth side wall (SW6) facing the sixth conductor circuit (L6). The second conductor circuit (L2) has a second width (W2).

As illustrated in FIGS. 1A and 3D, there is a third space (SP3) between the first conductor circuit (L1) and the third conductor circuit (L3). There is a fourth space (SP4) between the first conductor circuit (L1) and the fourth conductor circuit (L4). As illustrated in FIGS. 1A and 3D, the third space (SP3) has a third width (W3) and the fourth space (SP4) has a fourth width (W4). As illustrated in FIGS. 1B and 3D, there is a fifth space (SP5) between the second conductor circuit (L2) and the fifth conductor circuit (L5). There is a sixth space (SP6) between the second conductor circuit (L2) and the sixth conductor circuit (L6). As illustrated in FIGS. 1B and 3D, the fifth space (SP5) has a fifth width (W5), and the sixth space (SP6) has a sixth width (W6).

The first width (W1) of the first conductor circuit (L1), the second width (W2) of the second conductor circuit (L2), the third width (W3) of the third space (SP3), the fourth width (W4) of the fourth space (SP4), the fifth width (W5) of the fifth space (SP5), and the sixth width (W6) of the sixth space (SP6) are measured on the first surface (F) of the first resin insulating layer 10. In the embodiment, the third width (W3) and the fourth width (W4) are each 5 μm or more and 14 μm or less. The fifth width (W5) and the sixth width (W6) are each 20 μm or more.

As illustrated in FIG. 1C, the first upper surface (U1) of the first conductor circuit (L1) has a rough surface (unevenness) (RF). As illustrated in FIG. 1D, the second upper surface (U2), the fifth side wall (SW5) and the sixth side wall (SW6) of the second conductor circuit (L2) each have a rough surface (unevenness) (RF).

As illustrated in FIG. 3D, the second resin insulating layer 20 fills the spaces (SP3, SP4, SP5, SP6). For example, when pressed, the second resin insulating layer 20 enters the third space (SP3), and the third space (SP3) is filled with the second resin insulating layer 20. When pressed, the second resin insulating layer 20 enters the fourth space (SP4), and the fourth space (SP4) is filled with the second resin insulating layer 20. When pressed, the second resin insulating layer 20 enters the fifth space (SP5), and the fifth space (SP5) is filled with the second resin insulating layer 20. When pressed, the second resin insulating layer 20 enters the sixth space (SP6), and the sixth space (SP6) is filled with the second resin insulating layer 20.

The narrower a space (SP) between conductor circuits is, the more difficult it is to fill the space (SP) with the second resin insulating layer 20. And, a rough surface (RF) on a side wall of a conductor circuit impedes the filling of the space (SP) with the second resin insulating layer 20.

In the printed wiring board 110 of the embodiment, the third width (W3) and the fourth width (W4) are each 5 μm or more and 14 μm or less. The third width (W3) and the fourth width (W4) are small. However, as illustrated in FIGS. 1C and 2C, each the side walls of the first conductor circuit (L1) does not entirely have a rough surface. In the example of FIG. 1C, no rough surface is formed on the entire side walls. In the example of FIG. 2C, no rough surface is formed on a part of each of the side walls. Therefore, even when the width of the third space is small, the second resin insulating layer 20 easily enters the third space (SP3). The second resin insulating layer 20 easily enters the fourth space (SP4). The third space (SP3) can be filled with the second resin insulating layer 20. The fourth space (SP4) can be filled with the second resin insulating layer 20.

The entire side walls of the first conductor circuit (L1) have no rough surface. Therefore, when the second resin insulating layer 20 enters the spaces (SP3, SP4), the second resin insulating layer 20 can smoothly slide on the side walls (SW3, SW4) of the first conductor circuit (L1). Therefore, when the second resin insulating layer 20 enters the spaces (SP3, SP4), the second resin insulating layer 20 does not strongly press the first conductor circuit (L1). When the second resin insulating layer 20 enters the spaces (SP3, SP4), the first conductor circuit (L1) is unlikely to collapse.

When a width of a space (SP) is 10 μm or more and 14 μm or less, it is difficult to fill the space with the second resin insulating layer 20. Therefore, when a width of a space (SP) is 10 μm or more and 14 μm or less, the second example illustrated in FIG. 2C can be adopted. When the third width (W3) is 10 μm or more and 14 μm or less, a part of the third side wall (SW3) does not have a rough surface, and the rest of the third side wall (SW3) has a rough surface. When the fourth width (W4) is 10 μm or more and 14 μm or less, a part of the fourth side wall (SW4) does not have a rough surface, and the rest of the fourth side wall (SW4) has a rough surface.

In the second example illustrated in FIG. 2C, the third side wall (SW3) is formed of an upper side third side wall (SW3U) extending from the first upper surface (U1) and a lower side third side wall (SW3D) extending from the first lower surface (D1). The fourth side wall (SW4) is formed of an upper side fourth side wall (SW4U) extending from the first upper surface (U1) and a lower side fourth side wall (SW4D) extending from the first lower surface (D1). The upper side third side wall (SW3U) has a rough surface (RF3), and the upper side fourth side wall (SW4U) has a rough surface (RF4). The lower side third side wall (SW3D) and the lower side fourth side wall (SW4D) each do not have a rough surface (RF).

A length (h3U) of the upper side third side wall (SW3U) is shorter than a length (h3D) of the lower side third side wall (SW3D). A length (h4U) of the upper side fourth side wall (SW4U) is shorter than a length (h4D) of the lower side fourth side wall (SW4D). A ratio ((the length (h3D))/(the length (h3U))) of the length (h3D) of the lower side third side wall (SW3D) to the length (h3U) of the upper side third side wall (SW3U) is 1.5 or more and 2 or less. A ratio ((the length (h4D))/(the length (h4U))) of the length (h4D) of the lower side fourth side wall (SW4D) to the length (h4U) of the upper side fourth side wall (SW4U) is 1.5 or more and 2 or less.

When a width of a space (SP) is less than 10 μm, it is more difficult to fill the space (SP) with the second resin insulating layer 20. Therefore, when a width of a space (SP) is less than 10 µm, the first example illustrated in FIG. 1C can be adopted. When the third width (W3) is less than 10 µm, the entire third side wall (SW3) has no rough surface (RF). When the fourth width (W4) is less than 10 µm, the entire fourth side wall (SW4) has no rough surface (RF).

The third width (W3) is 10 µm or more and 14 µm or less. Further, the fourth width (W4) is less than 10 µm. In this case, the third side wall (SW3) is formed as in the second example illustrated in FIG. 2C. And, the fourth side wall (SW4) is formed as in the first example illustrated in FIG. 1C.

The smaller is a space (SP) between conductor circuits, the smaller is an amount of a resin that fills the space (SP). Even when the printed wiring board 110 is subjected to heat cycles, when a space (SP) between conductor circuits is small, an expansion amount and a contraction amount of a resin in the space (SP) are small. When a width of a space (SP) is 14 µm or less, even when only part of a side wall of a conductor circuit has a rough surface (RF), the resin insulating layer is unlikely to peel off from the conductor circuit. Even when an entire side wall of a conductor circuit has no rough surface (RF), the resin insulating layer is unlikely to peel off from the conductor circuit.

A signal can be transmitted via the first conductor circuit (L1). The side walls of the first conductor circuit (L1) have no rough surface. Or, a part of each of the side walls has no rough surface. Therefore, a transmission loss can be reduced. The first conductor circuit (L1) can transmit a high-speed signal.

When a space (SP) between conductor circuits is large, an amount of a resin filling the space (SP) is large. In this case, when the printed wiring board 110 is subjected to heat cycles, an expansion amount and a contraction amount of the resin in the space (SP) are large. Therefore, when the width of the space (SP) is 20 µm or more, the resin insulating layer is likely to peel off from the conductor circuits.

In the printed wiring board 110 of the embodiment, the fifth width (W5) of the fifth space (SP5) and the sixth width (W6) of the sixth space (SP6) are each 20 µm or more. Therefore, the upper surface (the second upper surface (U2) and the side walls (the fifth side wall (SW5) and the sixth side wall (SW6)) of the second conductor circuit (L2) each have a rough surface (RF). A rough surface (RF) is formed on the entire second upper surface (U2). A rough surface (RF) is formed on the entire fifth side wall (SW5). A rough surface (RF) is formed on the entire sixth side wall (SW6). Even when the widths (W5, W6) of the spaces are each 20 µm or more, the second resin insulating layer 20 is unlikely to peel off from the second conductor circuit (L2).

The first width (W1) of the first conductor circuit (L1) and the second width (W2) of the second conductor circuit (L2) are substantially equal to each other. Or, the two are different from each other. When the two are different from each other, it is desirable that the second width (W2) be larger than the first width (W1). For example, the first width (W1) is 7.5 µm or more and 15 µm or less, and the second width (W2) is 50 µm or more and 150 µm or less. A thickness (h1) of the first conductor circuit (L1) and a thickness (h2) of the second conductor circuit (L2) are each desirably 7.5 µm or more and 15 µm or less. The thickness (h1) and the thickness (h2) are substantially equal to each other. When the thickness (h1) exceeds 15 it is difficult to fill the spaces (SP3, SP4) with the second resin insulating layer 20.

As illustrated in FIG. 1D, a size of unevenness (RF5) of the fifth side wall (SW5) is smaller than a size of unevenness (RF2) of the second upper surface (U2). A size of unevenness (RF6) of the sixth side wall (SW6) is smaller than the size of the unevenness (RF2) of the second upper surface (U2). A size of unevenness (RF1) of the first upper surface (U1) and the size of the unevenness (RF2) of the second upper surface (U2) are substantially equal to each other. When the side walls (SW3, SW4) of the first conductor circuit (L1) each have a rough surfaces (RF), a size of the rough surface (RF) of each of the side walls (SW3, SW4) of the first conductor circuit (L1) is smaller than the size of the unevenness (RF5) of the fifth side wall (SW5). The sizes of the rough surfaces (RF3, RF4) of the side walls (SW3, SW4) of the first conductor circuit (L1) are each smaller than the size of the unevenness (RF6) of the sixth side wall (SW6).

The sizes of the unevennesses of the upper surfaces (U1, U2) of the conductor circuits are each expressed using an arithmetic mean roughness (Ra). When the arithmetic mean roughness (Ra) is 0.5 µm or more, it is determined that the upper surface of the conductor circuit has unevenness. When the size of the unevenness is large, the rough surface (RF) may break when the second resin insulating layer 20 is formed. Or, the rough surface (RF) may break during heat cycles. Therefore, the arithmetic mean roughness (Ra) of the rough surface (RF) of each of the upper surfaces (U1, U2) of the conductor circuits is preferably 1.0 µm or less. When the upper surfaces (U1, U2) of the conductor circuits each have a rough surface (RF), the size (arithmetic mean roughness) of the rough surface (RF) is 0.5 µm or more and 1.0 µm or less.

The sizes of the unevennesses of the side walls (SW3, SW4, SW5, SW6) of the conductor circuits are each indicated using arithmetic mean roughness (Ra). When the arithmetic mean roughness (Ra) is 0.5 µm or more, it is determined that the side walls (SW3, SW4, SW5, SW6) of the conductor circuits each have unevenness. When the size of the unevenness is large, it is difficult to fill the spaces (SP) with the second resin insulating layer 20. Therefore, the arithmetic mean roughness (Ra) of the rough surface (RF) of each of the side walls (SW3, SW4, SW5, SW6) of the conductor circuits is preferably 1.0 µm or less. When the side walls (SW3, SW4, SW5, SW6) of the conductor circuits each have a rough surface (RF), the size (arithmetic mean roughness) of the rough surface (RF) is 0.5 µm or more and 1.0 µm or less.

When a roughness (arithmetic mean roughness) of an upper surface of a conductor circuit is 0.01 µm or more and 0.2 µm or less, it is determined that the upper surface of the conductor circuit does not have a rough surface (RF).

When a roughness (arithmetic mean roughness) of a side wall of a conductor circuit is 0.01 µm or more and 0.2 µm or less, it is determined that the side wall of the conductor circuit does not have a rough surface (RF).

When the roughness (arithmetic mean roughness) of the upper side third side wall (SW3U) is 0.5 µm or more and 1.0 µm or less, the upper side third side wall (SW3U) has a rough surface (RF3). When the roughness (arithmetic mean roughness) of the lower side third side wall (SW3D) is 0.01 µm or more and 0.2 µm or less, the lower side third side wall (SW3D) does not have a rough surface (RF).

When the roughness (arithmetic mean roughness) of the upper side fourth side wall (SW4U) is 0.5 µm or more and 1.0 µm or less, the upper side fourth side wall (SW4U) has a rough surface (RF4). When the roughness (arithmetic mean roughness) of the lower side fourth side wall (SW4D) is 0.01 µm or more and 0.2 µm or less, the lower side fourth side wall (SW4D) does not have a rough surface (RF).

FIG. 2A illustrates a part of the conductor layer 30 of the printed wiring board 110 of the embodiment. FIG. 2A is a plan view. As illustrated in FIG. 2A, the conductor layer 30 includes a seventh conductor circuit (L7) and conductor circuits (an eighth conductor circuit (L8) and a ninth conductor circuit (L9)) sandwiching the seventh conductor circuit (L7). The eighth conductor circuit (L8) is positioned to the right of the seventh conductor circuit (L7), and the ninth conductor circuit (L9) is positioned to the left of the seventh conductor circuit (L7). FIG. 2B is a cross-sectional view of the seventh conductor circuit (L7). The seventh conductor circuit (L7) has a third lower surface (D3) in contact with the first surface (F) of the first resin insulating layer 10, a third upper surface (U3) on the opposite side with respect to the third lower surface (D3), an eighth side wall (SW8) facing the eighth conductor circuit (L8), and a ninth side wall (SW9) facing the ninth conductor circuit (L9). The seventh conductor circuit (L7) has a seventh width (W7). There is an eighth space (SP8) between the seventh conductor circuit (L7) and the eighth conductor circuit (L8). There is a ninth space (SP9) between the seventh conductor circuit (L7) and the ninth conductor circuit (L9). The eighth space (SP8) has an eighth width (W8), and the ninth space (SP9) has a ninth width (W9). The seventh width (W7), the eighth width (W8), and the ninth width (W9) are measured on the first surface (F) of the first resin insulating layer 10. The eighth width (W8) and the ninth width (W9) are each 5 μm or more and less than 10 μm. As illustrated in FIG. 2B, the third upper surface (U3) of the seventh conductor circuit (L7) has unevenness (RF3), and the eighth side wall (SW8) and the ninth side wall have no unevenness. The entire third upper surface (U3) has a rough surface. The entire eighth side wall (SW8) has no unevenness. The entire ninth side wall has no unevenness. The eighth width (W8) and the ninth width (W9) are each less than 10 μm. However, the eighth side wall (SW8) and the ninth side wall have no unevenness. Therefore, even when the eighth width (W8) is small, the eighth space (SP8) can be filled with the second resin insulating layer 20. Even when the ninth width (W9) is small, the ninth space (SP9) can be filled with the second resin insulating layer 20.

FIGS. 3A-3D illustrate manufacturing processes of the printed wiring board 110 of the embodiment.

The conductor layer 30 is formed on the first resin insulating layer 10 using a normal printed wiring board technology (FIG. 3A). The conductor layer 30 includes the first conductor circuit (L1), the second conductor circuit (L2), the third conductor circuit (L3), the fourth conductor circuit (L4), the fifth conductor circuit (L5), and the sixth conductor circuit (L6). A resist (Re) is formed on the first resin insulating layer 10 and the conductor layer 30. The upper surface (second upper surface) (U2) and the side walls (SW5, SW6) of the second conductor circuit (L2) are exposed using a photographic technology. An upper surface and side walls of the fifth conductor circuit (L5) are exposed. An upper surface and side walls of the sixth conductor circuit (L6) are exposed. The upper surface (first upper surface) (U1) and the side walls (SW3, SW4) of the first conductor circuit (L1) are covered by the resist (Re). An upper surface and side walls of the third conductor circuit (L3) are covered by the resist (Re). An upper surface and side walls of the fourth conductor circuit (L4) are covered by the resist (Re). After that, the resist (Re) is polished such that the upper surface (first upper surface) (U1) of the first conductor circuit (L1), the upper surface of the third conductor circuit (L3), and the upper surface of the fourth conductor circuit (L4) are exposed (FIG. 3B). After that, the intermediate substrate illustrated in FIG. 3B is immersed in a chemical solution for forming rough surfaces (RF). As a result, the rough surface (RF1) is formed on the first upper surface (U1) of the first conductor circuit (L1). The rough surfaces (RF2, RF5, RF6) are respectively formed on the second upper surface (U2) and the side walls (SW5, SW6) of the second conductor circuit (L2). The side walls (SW3, SW4) of the first conductor circuit (L1) are covered by the resist (Re). Therefore, no rough surface is formed on the side walls (SW3, SW4) of the first conductor circuit (L1). Then, the resist (Re) is removed (FIG. 3C). The second resin insulating layer 20 is formed on the first resin insulating layer 10 and the conductor layer 30. The printed wiring board 110 is completed (FIG. 3D).

The intermediate substrate illustrated in FIG. 3B can be irradiated with plasma. The plasma is irradiated from above the upper surface (first upper surface) (U1) of the first conductor circuit (L1). As a result, the upper side third side wall (SW3U) and the upper side fourth side wall (SW4U) are exposed. The lower side third side wall (SW3D) and the lower side fourth side wall (SW4D) are covered by the resist (Re). After that, rough surfaces (RF) are formed on the surfaces exposed to the outside. The rough surface (RF1) is formed on the first upper surface (U1) of the first conductor circuit (L1). The rough surfaces (RF3, RF4) are respectively formed on the upper side third side wall (SW3U) and the upper side fourth side wall (SW4U). The rough surfaces (RF2, RF5, RF6) are respectively formed on the second upper surface (U2) and the side walls (SW5, SW6) of the second conductor circuit (L2). The lower side third side wall (SW3D) and the lower side fourth side wall (SW4D) are covered by the resist (Re). Therefore, no rough surface (RF) is formed on the lower side third side wall (SW3D) and the lower side fourth side wall (SW4D). Then, the resist (Re) is removed. The printed wiring board 110 having the first conductor circuit (L1) illustrated in FIG. 2C is manufactured.

As illustrated in FIG. 4 of Japanese Patent Application Laid-Open Publication No. 2000-22334, a surface of an interlayer resin insulating agent is pressed in Japanese Patent Application Laid-Open Publication No. 2000-22334. Due to the pressing, the conductor circuits and the roughened layer may be subjected to a pressure. Then, the smaller the spaces between the conductor circuits are, the larger the pressure may become. For example, the roughened layer is expected to break. When the roughened layer breaks, a short circuit between the conductor circuits could occur. When widths of the conductor circuits are small, the conductor circuits are expected to collapse.

When a resin insulating layer is pressed into the spaces between the conductor circuits, the roughened layer formed on side walls of the conductor circuits may act as resistance. Therefore, when the entire side walls of the conductor circuits have the roughened layer, the spaces between the conductor circuits may not be filled completely with the resin insulating layer. For example, voids may be contained in the resin insulating layer. Therefore, when the printed wiring board is subjected to heat cycles, cracks may occur in the resin insulating layer.

A printed wiring board according to an embodiment of the present invention includes: a first resin insulating layer having a first surface and a second surface on the opposite side with respect to the first surface; a conductor layer formed on the first surface; and a second resin insulating layer formed on the first surface and the conductor layer. The conductor layer includes a first conductor circuit, conductor circuits (a third conductor circuit and a fourth conductor circuit) sandwiching the first conductor circuit, a second conductor circuit, and conductor circuits (a fifth conductor circuit and a sixth conductor circuit) sandwiching the second conductor circuit. The third conductor circuit is positioned to the right of the first conductor circuit. The fourth conductor circuit is positioned to the left of the first conductor circuit. The fifth conductor circuit is positioned to the right of the second conductor circuit. The sixth conductor circuit is positioned to the left of the second conductor circuit. The first conductor circuit has a first lower surface in contact with the first surface, a first upper surface on the opposite side with respect to the first lower surface, a third side wall facing the third conductor circuit, and a fourth side wall facing the fourth conductor circuit. The second conductor circuit has a second lower surface in contact with the first surface, a second upper surface on the opposite side with respect to the second lower surface, a fifth side wall facing the fifth conductor circuit, and a sixth side wall facing the sixth conductor circuit. The first conductor circuit has the first width. The second conductor circuit has a second width. There is a third space between the first conductor circuit and the third conductor circuit. There is a fourth space between the first conductor circuit and the fourth conductor circuit. There is a fifth space between the second conductor circuit and the fifth conductor circuit. There is a sixth space between the second conductor circuit and the sixth conductor circuit. The third space has a third width. The fourth space has a fourth width. The fifth space has a fifth width. The sixth space has a sixth width. The first width, the second width, the third width, the fourth width, the fifth width, and the sixth width are measured on the first surface. The third width and the fourth width are each 5 μm or more and 14 μm or less. And, when the fifth width and the sixth width are each 20 μm or more, the first upper surface, the second upper surface, the fifth side wall, and the sixth side wall each have unevenness.

A printed wiring board according to an embodiment of the present invention includes the first resin insulating layer, the conductor layer on the first resin insulating layer, and the second resin insulating layer on the first resin insulating layer and the conductor layer. The conductor layer includes the first conductor circuit and the conductor circuits (the third conductor circuit and the fourth conductor circuit) sandwiching the first conductor circuit. The width of the third space between the first conductor circuit and the third conductor circuit is 5 μm or more and 14 μm or less. Since the third space is narrow, it is difficult to fill the third space with the second resin insulating layer. The width of the fourth space between the first conductor circuit and the fourth conductor circuit is 5 μm or more and 14 μm or less. Since the fourth space is narrow, it is difficult to fill the fourth space with the second resin insulating layer. However, in the printed wiring board of the embodiment, it is not essential to form unevennesses on the side walls of the first conductor circuit. For example, the entire side walls of the first conductor circuit have no unevenness. Or, a part of each the side walls of the first conductor circuit has no unevenness. Therefore, according to the printed wiring board of the embodiment, even when the widths of the spaces between the conductor circuits are each 5 μm or more and 14 μm or less, the spaces can be filled with the second resin insulating layer. By pressing the second resin insulating layer, the second resin insulating layer enters the spaces.

When the printed wiring board is subjected to heat cycles, the second resin insulating layer that fills the space between the first conductor circuit and the third conductor circuit repeatedly expands and contracts. The second resin insulating layer that fills the space between the first conductor circuit and the fourth conductor circuit repeatedly expands and contracts. Due to the expansion, the first conductor circuit is pressed. Due to the contraction, the first conductor circuit is pulled. Then, when the width of the first conductor circuit is 15 μm or less, the first conductor circuit is expected to collapse under the influence of the expansion and contraction. However, in the printed wiring board of the embodiment, it is not essential to form unevennesses on the side walls of the first conductor circuit. For example, the side walls of the first conductor circuit completely have no unevenness. Or, a part of each the side walls of the first conductor circuit has no unevenness. Adhesion between the side walls of the first conductor circuit and the second resin insulating layer is weak. Therefore, a force pressing the first conductor circuit is weak. A force pulling the first conductor circuit is weak. Further, when the second resin insulating layer enters the spaces, the second resin insulating layer can smoothly slide on the side walls of the first conductor circuit. Even when the width of the first conductor circuit is 15 μm or less, the first conductor circuit is unlikely to collapse.

The side walls of the first conductor circuit completely have no unevenness. Or, a part of each the side walls of the first conductor circuit has no unevenness. Therefore, a high-speed signal can be transmitted via the first conductor circuit.

The conductor layer includes the second conductor circuit and the conductor circuits (the fifth conductor circuit and the sixth conductor circuit) sandwiching the second conductor circuit. The width of the fifth space between the second conductor circuit and the fifth conductor circuit is 20 μm or more. The width of the sixth space between the second conductor circuit and the sixth conductor circuit is 20 μm or more. When the widths of the spaces are each 20 μm or more, an amount of the second resin insulating layer filling the spaces is large. Therefore, when the printed wiring board is subjected to heat cycles, an expansion amount and a contraction amount of the resin filling the fifth space are large. An expansion amount and a contraction amount of the resin filling the sixth space are large. An interface between the side walls of the second conductor circuit and the second resin insulating layer is repeatedly stressed. When adhesion between the side walls of the second conductor circuit and the second resin insulating layer is weak, peeling occurs between the two. Then, the second resin insulating layer may break. However, in the printed wiring board of the embodiment, the side walls of the second conductor circuit each have unevenness. The second resin insulating layer is unlikely to peel off from the side walls of the second conductor circuit.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a first resin insulating layer;
a second resin insulating layer formed on a surface of the first resin insulating layer; and
a conductor layer formed on the surface of the first resin insulating layer such that the second resin insulating layer is covering the conductor layer and that the conductor layer includes a first conductor circuit, a second conductor circuit, a third conductor circuit positioned to a first side of the first conductor circuit, a fourth conductor circuit positioned to a second side of the first conductor circuit on an opposite side with respect to the first side of the first conductor circuit, a fifth conductor circuit positioned to a first side of the second conductor circuit, and a sixth conductor circuit positioned to a second side of the second conductor circuit on an opposite side with respect to the first side of the second conductor circuit such that the third and fourth conductor circuits are sandwiching the first conductor circuit and that the fifth and sixth conductor circuits are sandwiching the second conductor circuit, wherein the first conductor circuit has a first width, the second conductor circuit has a second width, the first and third conductor circuits are positioned to form a third space having a third width between the first and third conductor circuits such that the third width is in a range of 5 μm to 14 μm, the first and fourth conductor circuits are positioned to form a fourth space having a fourth width between the first and fourth conductor circuits such that the fourth width is in a range of 5 μm to 14 μm, the second and fifth conductor circuits are positioned to form a fifth space having a fifth width between the second and fifth conductor circuits, the second and sixth conductor circuits are positioned to form a sixth space having a sixth width between the second and sixth conductor circuits, the first conductor circuit has a first lower surface in contact with the surface of the first resin insulating layer, a first upper surface on an opposite side with respect to the first lower surface, a third side wall facing the third conductor circuit, and a fourth side wall facing the fourth conductor circuit, the second conductor circuit has a second lower surface in contact with the surface of the first resin insulating layer, a second upper surface on an opposite side with respect to the second lower surface, a fifth side wall facing the fifth conductor circuit, and a sixth side wall facing the sixth conductor circuit, and when each of the fifth and sixth widths is 20 μm or more, the first upper surface of the first conductor circuit, and the second upper surface, fifth side wall and sixth side wall of the second conductor circuit are formed to have unevenness.

2. The printed wiring board according to claim 1, wherein the conductor layer is formed such that each of the third width of the third space and the fourth width of the fourth space is less than 10 μm and that the third and fourth side walls of the first conductor circuit have no unevenness.

3. The printed wiring board according to claim 2, wherein the conductor layer is formed such that the first width of the first conductor circuit and the second width of the second conductor circuit are substantially equal to each other.

4. The printed wiring board according to claim 2, wherein the conductor layer is formed such that the second width of the second conductor circuit is larger than the first width of the first conductor circuit.

5. The printed wiring board according to claim 2, wherein the conductor layer is formed such that a size of the unevenness on the fifth side wall of the second conductor circuit is smaller than a size of the unevenness on the second upper surface of the second conductor circuit and that a size of the unevenness on the sixth side wall of the second conductor circuit is smaller than the size of the unevenness on the second upper surface of the second conductor circuit.

6. The printed wiring board according to claim 5, wherein the conductor layer is formed such that a size of the unevenness on the first upper surface and the size of the unevenness on the second upper surface are substantially equal to each other.

7. The printed wiring board according to claim 2, wherein a size of the unevenness on the first upper surface of the first conductor circuit and a size of the unevenness on the second upper surface of the second conductor circuit are an arithmetic mean roughness Ra such that each of the size of the unevenness on the first upper surface and the size of the unevenness on the second upper surface is in a range of 0.5 μm to 1.0 μm.

8. The printed wiring board according to claim 1, wherein the conductor layer is formed such that the third and fourth side walls of the first conductor circuit have no unevenness.

9. The printed wiring board according to claim 8, wherein the conductor layer is formed such that the third side wall of the first conductor circuit is determined to have no unevenness when an arithmetic mean roughness of the third side wall is in a range of 0.01 μm to 0.2 μm and that the fourth side wall of the first conductor circuit is determined to have no unevenness when an arithmetic mean roughness of the fourth side wall is in a range of 0.01 μm to 0.2 μm.

10. The printed wiring board according to claim 1, wherein the conductor layer is formed such that the third side wall of the first conductor circuit includes an upper side third side wall extending from the first upper surface and a lower side third side wall extending from the first lower surface, that the fourth side wall of the first conductor circuit includes an upper side fourth side wall extending from the first upper surface and a lower side fourth side wall extending from the first lower surface, that each of the third and fourth widths is 10 μm or more, that each of the upper side third side wall and upper side fourth side wall has unevenness, and that each of the lower side third side wall and lower side fourth side wall has no unevenness.

11. The printed wiring board according to claim 10, wherein the conductor layer further includes a seventh conductor circuit, an eighth conductor circuit positioned to a first side of the seventh conductor circuit, and a ninth conductor circuit positioned to a second side of the seventh conductor circuit on an opposite side with respect to the seventh side of the first conductor circuit such that the eighth and ninth conductor circuits are sandwiching the seventh conductor circuit, the seventh conductor circuit has a seventh width, the seventh and eighth conductor circuits are positioned to form an eighth space having an eighth width between the seventh and eighth conductor circuits such that the eighth width is in a range of 5 μm to 10 μm, the seventh and ninth conductor circuits are positioned to form a ninth space having a ninth width between the seventh and ninth conductor circuits such that the ninth width is in a range of 5 μm to 10 μm, and the seventh conductor circuit has a third lower surface in contact with the surface of the first resin insulating layer, a third upper surface on an opposite side with respect to the third lower surface, an eighth side wall facing the eighth conductor circuit, and a ninth side wall facing the ninth conductor circuit such that the third upper surface has unevenness and that each of the eighth and ninth side walls have no unevenness entirely.

12. The printed wiring board according to claim 10, wherein the conductor layer is formed such that a length of the upper side third side wall of the first conductor circuit is shorter than a length of the lower side third side wall of the first conductor circuit and that a length of the upper side fourth side wall of the first conductor circuit is shorter than a length of the lower side fourth side wall of the first conductor circuit.

13. The printed wiring board according to claim 12, wherein a ratio of the length of the lower side third side wall to the length of the upper side third side wall is in a range of 1.5 to 2.

14. The printed wiring board according to claim 10, wherein the conductor layer is formed such that the lower side third side wall of the first conductor circuit is determined to have no unevenness when an arithmetic mean roughness of the lower side third side wall is in a range of 0.01 μm to 0.2 μm, that the lower side fourth side wall of the first conductor circuit is determined to have no unevenness when an arithmetic mean roughness of the lower side fourth side wall is in a range of 0.01 μm to 0.2 μm, that the upper side third side wall of the first conductor circuit is determined to have unevenness when an arithmetic mean roughness of the upper side third side wall is in a range of 0.5 μm to 1.0 μm, and that the upper side fourth side wall of the first conductor circuit is determined to have unevenness when an arithmetic mean roughness of the upper side fourth side wall is in a range of 0.5 μm to 1.0 μm.

15. The printed wiring board according to claim 1, wherein the conductor layer is formed such that the first width of the first conductor circuit and the second width of the second conductor circuit are substantially equal to each other.

16. The printed wiring board according to claim 1, wherein the conductor layer is formed such that the second width of the second conductor circuit is larger than the first width of the first conductor circuit.

17. The printed wiring board according to claim 1, wherein the conductor layer is formed such that a size of the unevenness on the fifth side wall of the second conductor circuit is smaller than a size of the unevenness on the second upper surface of the second conductor circuit and that a size of the unevenness on the sixth side wall of the second conductor circuit is smaller than the size of the unevenness on the second upper surface of the second conductor circuit.

18. The printed wiring board according to claim 17, wherein the conductor layer is formed such that a size of the unevenness on the first upper surface and the size of the unevenness on the second upper surface are substantially equal to each other.

19. The printed wiring board according to claim 1, wherein a size of the unevenness on the first upper surface of the first conductor circuit and a size of the unevenness on the second upper surface of the second conductor circuit are an arithmetic mean roughness Ra such that each of the size of the unevenness on the first upper surface and the size of the unevenness on the second upper surface is in a range of 0.5 μm to 1.0 μm.

20. The printed wiring board according to claim 1, wherein the conductor layer is formed such that the first width of the first conductor circuit is in a range of 7.5 μm to 15 μm, that the second width of the second conductor circuit is in a rage of 50 μm to 150 μm, and that each of a thickness of the first conductor circuit and a thickness of the second conductor circuit is in a range of 7.5 μm to 15 μm.

* * * * *